United States Patent [19]
Itagaki et al.

[11] Patent Number: 4,788,522
[45] Date of Patent: Nov. 29, 1988

[54] IMAGE SENSING

[75] Inventors: Masanori Itagaki, Kawasaki; Kouji Mori, Yokohama; Tatsumi Ishiwata, Zushi; Taizo Yoshida, Ikeda, all of Japan

[73] Assignee: Ricoh Company, Ltd., Tokyo, Japan

[21] Appl. No.: 759,508

[22] Filed: Jul. 26, 1985

Related U.S. Application Data

[63] Continuation of Ser. No. 459,353, Jan. 20, 1983, abandoned.

[30] Foreign Application Priority Data

| Jan. 20, 1982 | [JP] | Japan | 57-5912 |
| Jan. 26, 1982 | [JP] | Japan | 57-9564 |
| Feb. 2, 1982 | [JP] | Japan | 57-14391 |
| Mar. 3, 1982 | [JP] | Japan | 57-33284 |
| Apr. 1, 1982 | [JP] | Japan | 57-54049 |
| Apr. 23, 1982 | [JP] | Japan | 57-67150 |
| Apr. 23, 1982 | [JP] | Japan | 57-68277 |

[51] Int. Cl.$^4$ .......................... H01L 31/08
[52] U.S. Cl. ............................ 338/15; 358/212
[58] Field of Search .......... 338/15; 358/212, 213.11, 358/294

[56] References Cited

FOREIGN PATENT DOCUMENTS 2103049 6/1982 United Kingdom ............ 358/212

OTHER PUBLICATIONS

Komiya et al., "A 2048-Element Contact Type Linear Image Sensor for Facsimile", 1981 IEEE IEDM-81, pp. 309–12.

Primary Examiner—E. A. Goldberg
Assistant Examiner—M. M. Lateef
Attorney, Agent, or Firm—Cooper & Dunham

[57] ABSTRACT

An image sensing device includes a plurality of photoelectric elements arranged in the form of a single array and divided into n number of blocks each of which includes m number of the photoelectric elements commonly connected at one end. In one form of the present invention, a single operational amplifier and m number of switching circuits are used to establish operational independency of the m×n photoelectric elements. In other forms, operational independecy of the m×n photoelectric elements is established by using an array of blocking diodes or operational amplifiers constructed in the form of IC, but all of the components of a driving or scanning circuit, including these blocking diodes or operational amplifiers, are so structured to be mounted on the same substrate which is remarkably compact in size. Also provided are various forms of photoelectric cells which are particularly suited to be incorporated into an image sensing device and methods for manufacturing the same.

3 Claims, 19 Drawing Sheets

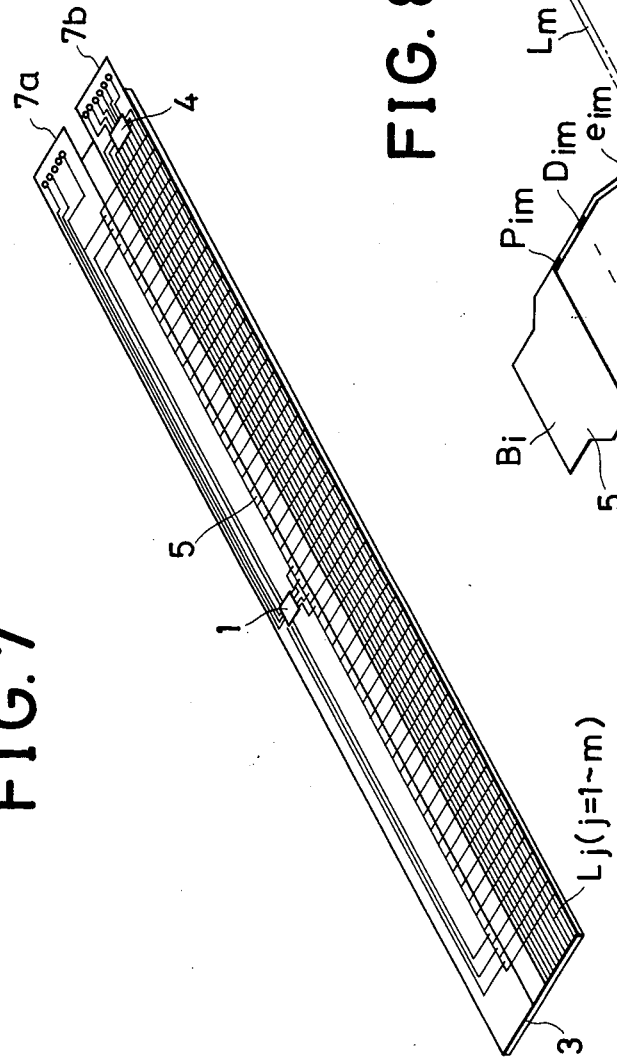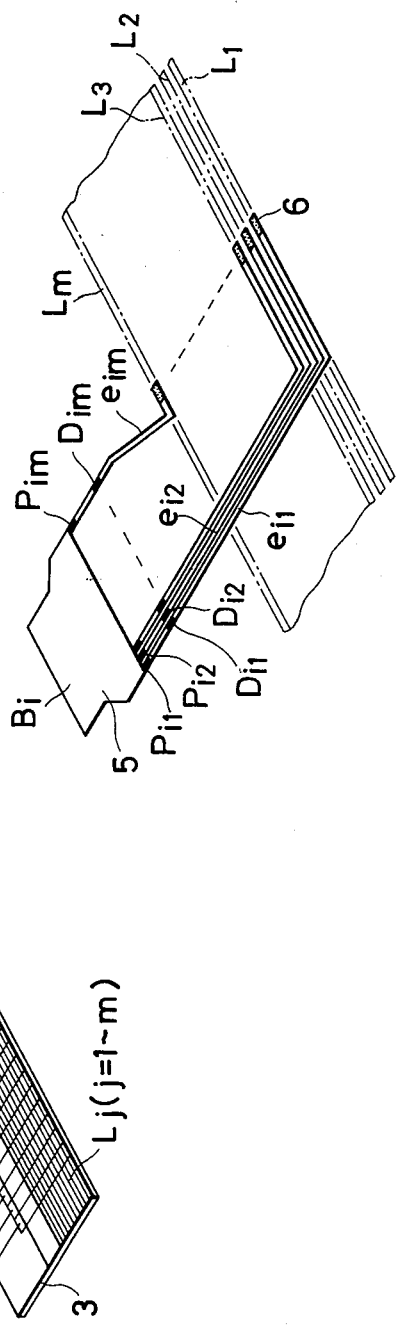

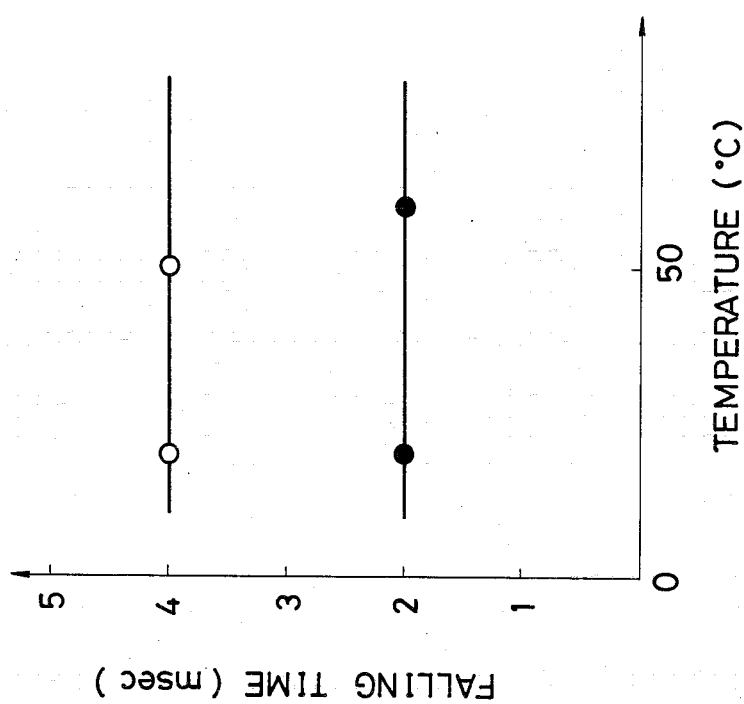
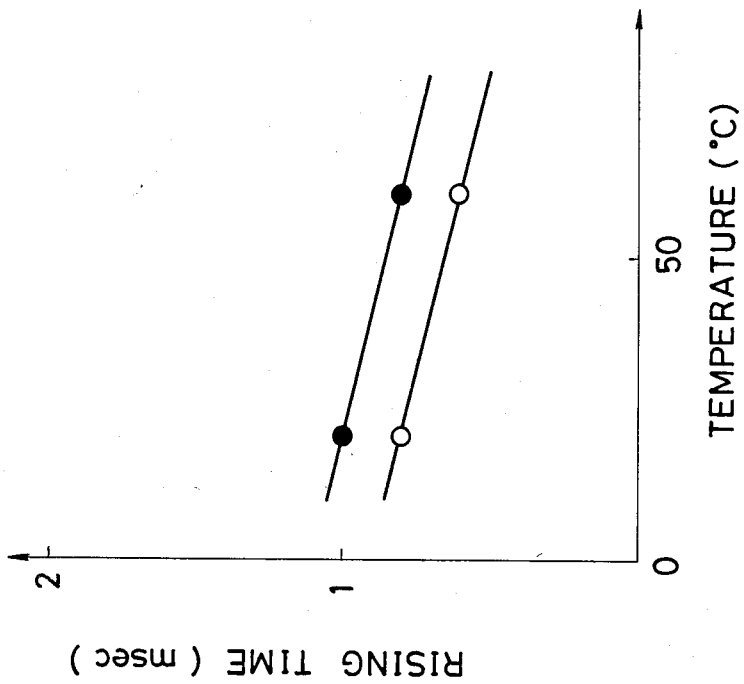

IMAGE SENSING

This is a continuation of application Ser. No. 459,353 filed Jan. 20, 1983, now abandoned.

BACKGROUND OF THE INVENTION

1. Field of the Invention

This invention generally relates to an image sensing device for converting light image information into electrical signals, and, in particular, to such an image sensing device which may be advantageously used as an image sensor of a facsimile machine and the like for reading the document information to be transmitted to a remote place. The present invention also relates to photoelectric elements which are particularly suited for use in an image sensing device and the method of manufacturing such photoelectric elements.

2. Description of the Prior Art

As is well known in the art, an image sensing device usually includes a plurality of light-sensitive or photoelectric elements arranged in the form of a single array, and the plurality of photoelectric elements are activated in timed sequence from one end of the array to the other in repetition thereby scanning a document to be read along scanning line sectors in a stepwise manner. In such an image sensing device, it is common practice to divide the plurality of photoelectric elements into a predetermined number of blocks and to provide a common electrode for each block thereby having one end of each of the photoelectric elements belonging to the same block connected to the corresponding common electrode mainly for simplification of wiring. With such a structure, it is true that wiring may be simplified, but each of the photoelectric elements looses an operative independency so that the image sensing device would suffer from stray signals unless an adequate measure is taken.

Such being the case, when it is so structured to group a plurality of light-sensitive elements into blocks, each of which includes a predetermined number of light-sensitive elements, then it is necessary to apply means for preventing the occurrence of stray signals. FIG. 1 illustrates one prior art approach for preventing the occurrence of stray signals in an image sensing device, which uses a plurality of blocking diodes one for each photoelectric element. As illustrated, a plurality of photoelectric elements $P_{ij}$ (i=1—n and j=1—m) are disposed in the form of a single array, and these elements are grouped into n blocks $B_1, B_2, \ldots, B_n$, each comprising m photoelectric elements. In each of the blocks, the top ends of the photoelectric elements are commonly connected to the corresponding common block terminal. For example, in the leftmost block, the top ends of the photoelectric elements $P_{11}, P_{12}, \ldots, P_{1m}$ are commonly connected to the corresponding block terminal $B_1$.

On the other hand, the bottom end of each of the photoelectric elements defines an individual electrode which is connected to the anode of the corresponding blocking diode $D_{ij}$. Each of the blocking diodes in one block, for example the diode $D_{11}$ has its cathode interconnected to the cathodes of the corresponding blocking diodes, $D_{21}, \ldots, D_{n1}$ for $D_{11}$, in the other blocks through respective interconnection lines. These interconnection lines are connected to ground through respective load resistors $R_L$ and also to an output terminal $V_0$ through analog switch $S_1, S_2, \ldots, S_m$, respectively. Provision of blocking diodes in this manner allows to establish operative independency for each of the photoelectric elements; however, it still suffers from various disadvantages since it is necessary to provide a relatively large number (m×n) of diodes corresponding in number to the photoelectric elements and the manufacture of such large number of diodes at a time tends to be expensive even if use is made of the thin film forming technology and moreover it tends to lower the yield.

FIG. 2 shows another prior art approach in which operational amplifiers are provided and their virtual ground is utilized to establish operative independency between the photoelectric elements. Similarly with the structure of FIG. 1, the top ends of the elements in each block in the arrangement of FIG. 2 are commonly connected, and the individual electrodes defined by the bottom ends of the photoelectric elements in one block are interconnected to the corresponding individual electrodes in the other blocks through the respective interconnections which are also connected to the inverting input of the respective operational amplifiers $A_1, A_2, \ldots, A_m$. These op amps have their outputs connected to the output terminal $V_0$ through respective analog switches $S_1, S_2, \ldots, S_m$ and their non-inverting inputs connected to ground. A resistor $R_f$ is connected between the output and the inverting input in each of the op amps thereby defining a feed-back loop. In such a structure, the inverting inputs of the op amps are, in effect, at virtual ground, so that the elements $P_{ij}$ may be operated independently one from another. However, the structure shown in FIG. 2 requires the provision of so many op amps corresponding to the number of the individual electrodes (m in the illustrated example), which also tends to push up the manufacturing cost partly because of difficulty in mounting of so many op amps.

A further prior art approach is illustrated in FIG. 3, in which case, use is made of a mxn bit shift register for directly driving an array of photoelectric elements. In this case, however, using a mxn bit shift register requires mxn number of connections to be made, which also pushes up the cost. Such a disadvantage can not be obviated even if the shift register is constructed in the form of an IC.

SUMMARY OF THE INVENTION

The disadvantages of the prior art are overcome with the present invention as will be fully described herein below.

It is therefore a primary object of the present invention to provide an improved image sensing device which may be operated at high speed.

Another object of the present invention is to provide an image sensing device which is particularly suited for use in a facsimile machine and the like.

A further object of the present invention is to provide an image sensing device which is relatively simple in structure and thus easy to manufacture with an enhanced yield rate.

A still further object of the present invention is to provide an image sensing device including a plurality of photoelectric elements arranged in the form of an array and grouped into blocks, each having a predetermined number of photoelectric elements which are commonly connected at one end, whereby a single operational amplifier and a plurality of transistor switches are used to prevent the image sensing device from suffering from stray signals.

A still further object of the present invention is to provide an image sensing device which also includes a scanning or driving circuit incorporated therein and yet which is still compact in overall size.

A still further object of the present invention is to provide photoelectric elements which are particularly suited to be incorporated into an image sensing device such as an optical reading unit of a facsimile machine.

A still further object of the present invention is to provide photoelectric elements which are high in light sensitivity and fast in light-responding speed, and, therefore, particularly suited to be incorporated into an image sensing device.

A still further object of the present invention is to provide a method for manufacturing photoelectric elements having enhanced photoelectric characteristics.

A still further object of the present invention is to provide a method for manufacturing photoelectric elements as incorporated into an image sensing device.

A still further object of the present invention is to provide a method for improving the photoelectric characteristics of a photoconductive film to be used as a light-responding element.

Other objects, advantages and novel features of the present invention will become apparent from the following detailed description of the invention when considered in conjunction with the accompanying drawings.

BRIEF DESCRIPTION OF THE DRAWINGS

FIG. 7 is a perspective view of the image sensing device which structurally corresponds to the embodiment of FIG. 6;

FIG. 8 is a fragmentary perspective view showing on an enlarged scale a part of the device of FIG. 7;

FIG. 10 is a fragmentary perspective view showing on an enlarged scale a part of the device of FIG. 11;

FIGS. 27–30 are graphs showing various characteristics of a photoelectric element constructed in accordance with the present invention;

DESCRIPTION OF THE PREFERRED EMBODIMENTS

Figure 1:
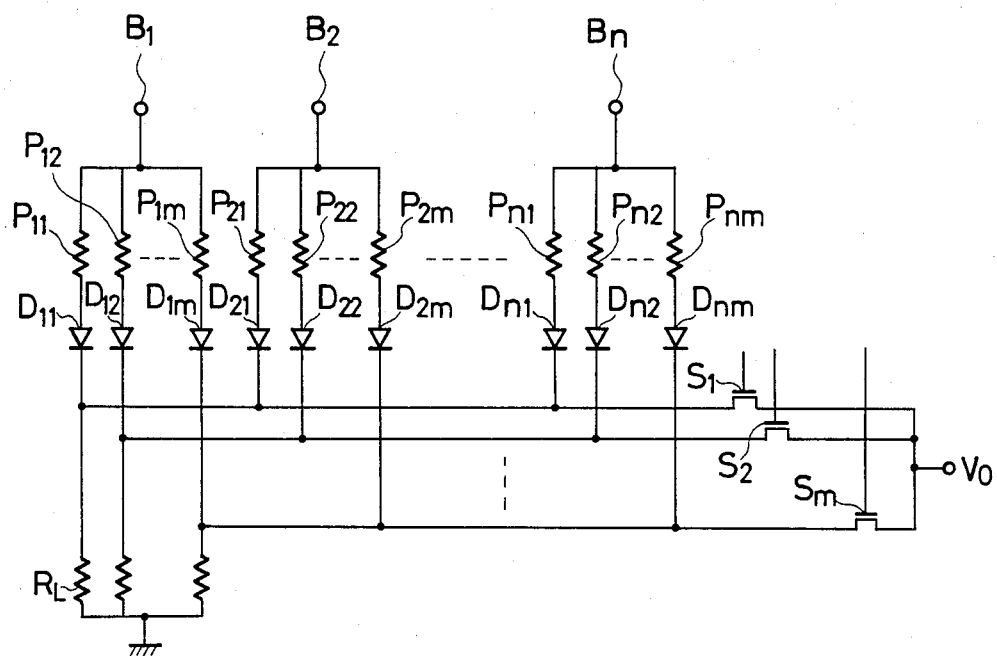
FIG. 1 is a schematic illustration showing a prior art image sensing device including an array of photoelectric elements and blocking diodes.
Figure 2:
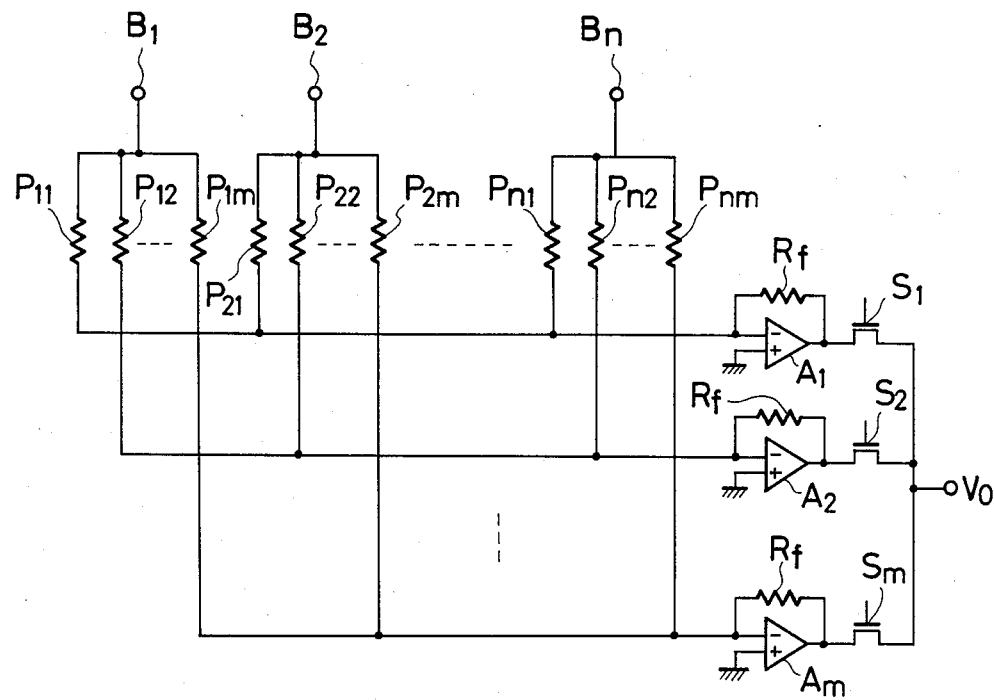
FIG. 2 is a schematic illustration showing another prior art image sensing device including an array of photoelectric elements and operational amplifiers.
Figure 3:
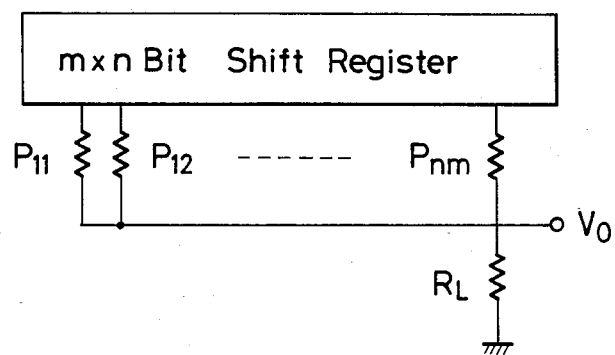
FIG. 3 is a schematic illustration showing a further prior art image sensing device including an array of photoelectric elements and a mxn bit shift register.
Figure 4:
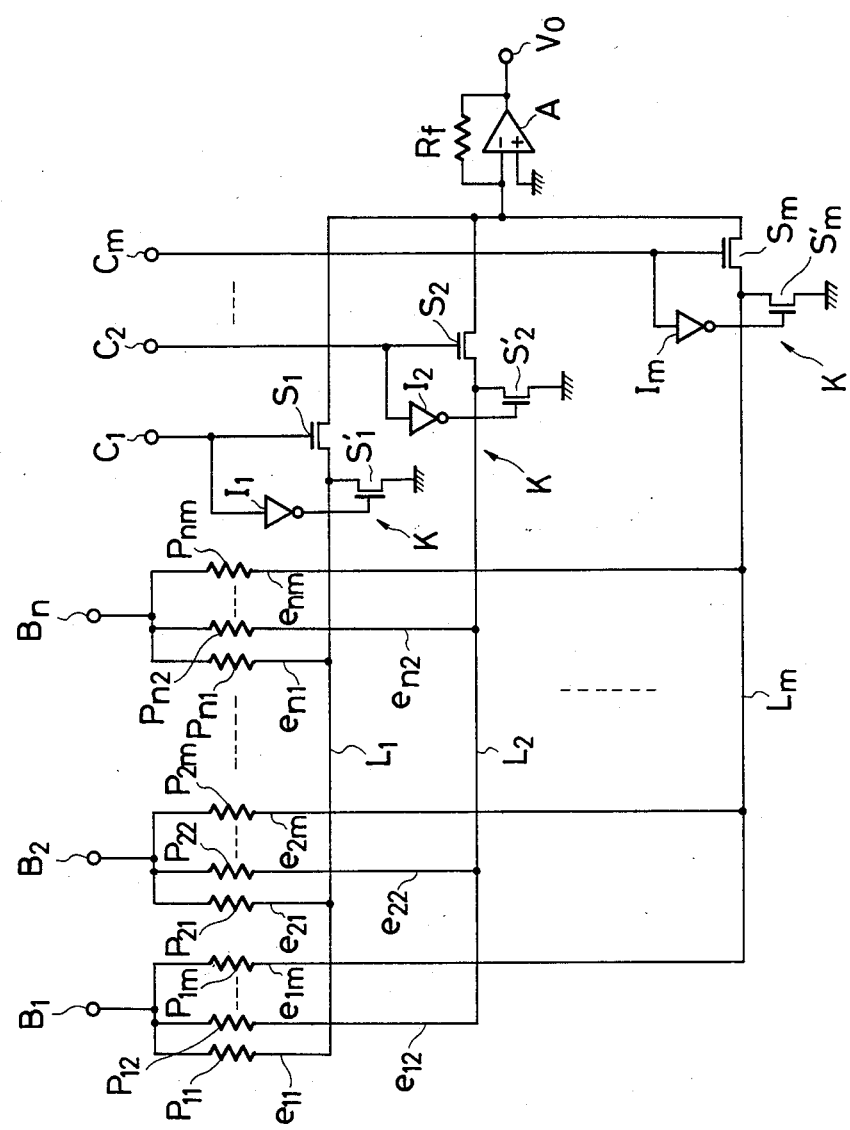
FIG. 4 is a schematic illustration showing one embodiment of the image sensing device constructed in accordance with the present invention.

Referring now to FIG. 4, there is schematically shown an image sensing device including a plurality (mxn) of photoelectric or photoconductive elements $P_{ij}$ arranged in the form of a single array. The mxn photoelectric elements $P_{ij}$ are divided into n blocks each of which includes m photoelectric elements. As shown, in each block, the top ends of the photoelectric elements $P_{ij}$ are commonly connected to form a common electrode which, in turn, is connected to the corresponding block terminal $B_1, B_2, \ldots,$ or $B_n$. The photoelectric elements $P_{ij}$ are made of a photoconductive material such as CdS, CdS/CdSe, amorphous Si, etc., and they function to convert light image signals into electrical image signals.

The bottom ends of photoelectric elements $P_{ij}$ are connected to respective individual electrodes. For example, for photoelectric elements $P_{11}, P_{12}, \ldots, P_{1m}$, individual electrodes $e_{11}, e_{12}, \ldots, e_{1m}$ are provided as connected, respectively. It is to be noted that the particular individual electrode $e_{1j}$ in one block is interconnected to the corresponding individual electrodes $e_{1j}$ in the other blocks through the corresponding interconnection. For example, the individual electrode $e_{11}$ in the leftmost block $B_1$ is connected, for example, to the corresponding individual electrode $e_{21}$ in the adjacent block $B_2$ and also to the corresponding individual electrode $e_{n1}$ in the block $B_n$ through the corresponding interconnection $L_1$. In like manners, the other individual electrodes are similarly connected to the corresponding individual electrodes through the corresponding interconnections $L_2, \ldots, L_m$.

The interconnections $L_1, L_2, \ldots, L_m$ are connected to the inverting input of an operational amplifier A through respective switching circuits K. The switching circuits K are identical in structure and each comprises a pair of MOS switches $S_i, S_i'$ ($i=1-m$), which function as analog switches, and an inverter $I_i$ ($i=1-m$). Described more in detail, in each of the switching circuits K, the source and drain of first MOS transistor $S_i$ is connected between the interconnection $L_i$ and the invering input of the operational amplifier A, and the source and drain of second MOS transistor $S_i'$ is connected between the interconnection $L_i$ and ground. Furthermore, the gate of the first MOS transistor $S_i$ is connected to the gate of the second MOS transistor $S_i'$ via the corresponding inverter $I_i$, and the gate of each of the first MOS transistors $S_i$ is connected to the corresponding terminal $C_i$ to which a control signal is supplied for controlling the operation of the corresponding MOS switch. In such a structure, if one of the paired MOS transistors $S_i$ and $S_i'$ in each switching circuit K is on, then the other is kept off.

Also as shown in FIG. 4, the operational amplifier A has its non-inverting input connected to ground and its output connected to the inverting input through a resistor $R_f$ thereby forming a feed-back loop. Accordingly, in the structure of FIG. 4, the inverting input of the operational amplifier A is at the virtual ground state.

Figure 5:
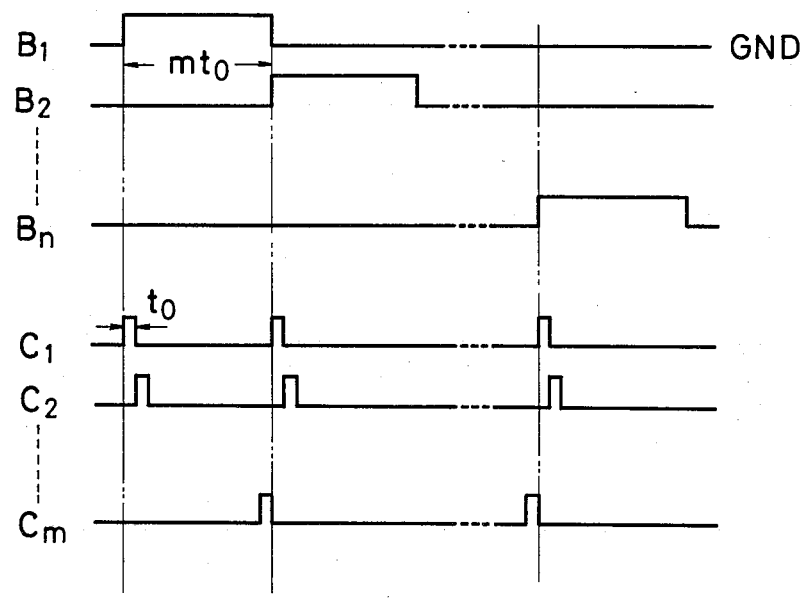
FIG. 5 is a timing chart useful for explaining the operation of the image sensing device of FIG. 4.

Now the operation of the image sensing device of FIG. 4 will be described with particular reference to the timing chart shown in FIG. 5. In FIG. 5 are shown control pulse signals to be applied to terminals $B_1-B_n$ and $C_1-C_m$. As shown, long period pulses each having the pulse width $mt_0$ are applied to the block terminals $B_1$ through $B_n$ in sequence; on the other hand, short period pulses each having the pulse width $t_0$ are applied to the control terminals $C_1$ through $C_m$ in sequence. These pulses may preferably have the amplitude in the range between 5 and 15V.

While a pulse having the pulse width $mt_0$ is being applied to the block terminal $B_1$, the other block terminals $B_2$ through $B_n$ are held in the non-selected state; on the other hand, short pulses having the pulse width $t_0$ are sequentially applied to the control terminals $C_1$ through $C_m$, so that the individual electrodes $e_{11}$ through $e_{1m}$ and thus the photoelectric elements $P_{11}$ through $P_{1m}$ in the block $B_1$ are set in the selected state in sequence. Even if the pulse is being applied to the block terminal $B_1$, the photoelectric elements are non-selected unless the short period pulse is also applied to the corresponding one of the control terminals $C_1$ through $C_m$. Thus, while the photoelectric elements $P_{ij}$ are in the non-selected state, their individual electrodes $e_{ij}$ are, in effect, connected to ground through the corresponding switching circuits K. On the other hand, under the conditions in which the long pulse is being applied to the block terminal $B_1$, when the short pulse having the pulse width $t_0$ is applied to one of the control terminals, the corresponding photoelectric element is set in the selected state, whereby the individual electrode of the selected element is made electrically connected to the inverting input of the operational amplifier A.

Therefore, by applying the short pulse having the pulse width $t_0$ to the control terminals $C_1$ through $C_m$ in sequence during the time period in which the long pulse having the pulse width $mt_0$ is being applied to the block terminal $B_1$, the photoelectric elements $P_{11}$ through $P_{1m}$ are set in the selected state in sequence. And, then, by applying the short pulse of $t_0$ to the control terminals $C_1$ through $C_m$ again in sequence while applying the long pulse of $mt_0$ to the next block terminal $B_2$, the photoelectric elements $P_{21}$ through $P_{2m}$ are set in the selected state in sequence. The similar operation is then repeated for the remaining blocks $B_3$ through $B_n$ to complete the scanning for the single line. It is to be noted that, in accordance with the present invention, stray signals are prevented from occurring since the individual electrodes of the photoelectric elements $P_{ij}$ are effectively grounded when the corresponding elements $P_{ij}$ are not selected.

Figure 6:
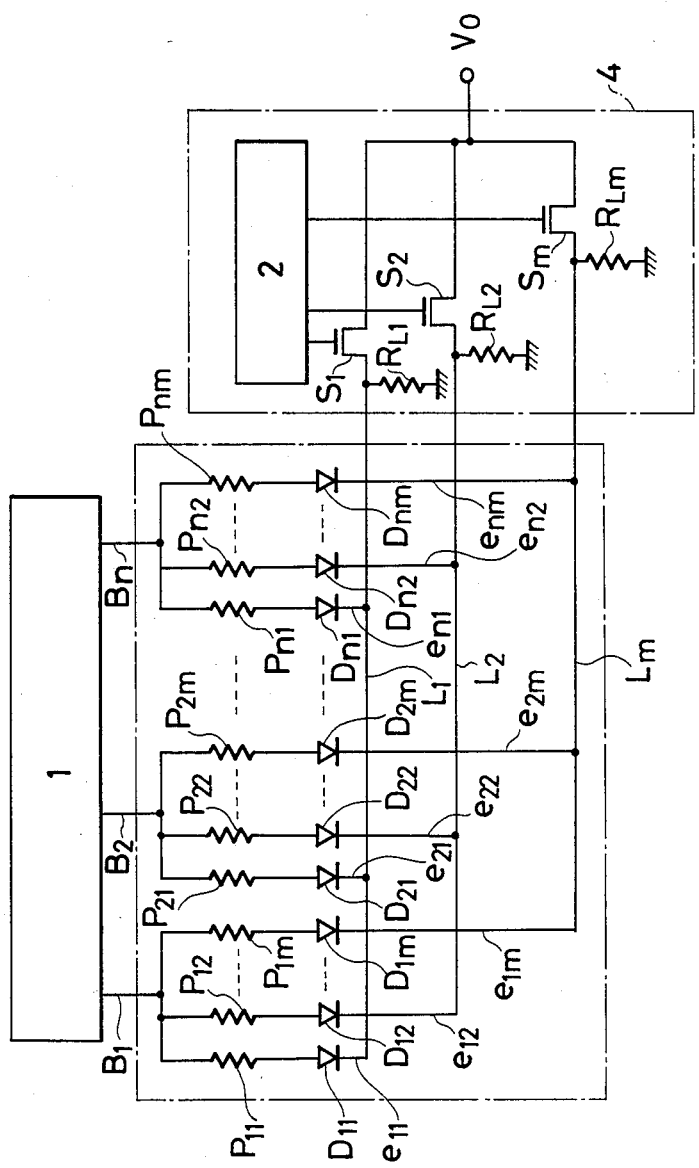
FIG. 6 is a schematic illustration showing another embodiment of the image sensing device constructed in accordance with the present invention.

FIG. 6 shows another embodiment of the present invention. As shown, the image sensing device includes a plurality (mxn) of light-receiving or photoelectric elements $P_{ij}$ which are arranged in the form of a single array and are grouped into n blocks each having m elements. The top ends of the elements $P_{ij}$ in each block are commonly connected to the corresponding common electrode $B_i$; whereas, their bottom ends are connected to the respective individual electrodes $e_{ij}$ via the respective blocking diodes $D_{ij}$. The individual electrodes $e_{i,1}$ ($i=1, \ldots, n$) are all connected to the interconnection $L_1$. The individual electrodes $e_{i,2}$ ($i=1, \ldots, n$) are all connected to the interconnection $L_2$. In a similar manner, the corresponding individual electrodes $e_{ij}$ one for each block are connected to the corresponding interconnection $L_j$. Furthermore, the interconnections $L_1, L_2, \ldots, L_m$ are connected to the output terminal $V_0$ via respective MOS transistors $S_j$ ($j=1, \ldots, m$) which function as analog switches. The source of the MOS transistor $S_j$ is connected to ground via the resistor $R_{Lj}$. Also provided is a n bit ( e.g., 54 bits ) shift register 1 constructed in the form of an IC chip as connected to the common electrodes $B_i$ ($i=1, \ldots, n$). Another m bit ( e.g., 32 bits ) shift register 2 is provided as connected to the gates of the MOS transistors $S_j$. It is to be noted that the MOS transistors $S_j$, resistors $R_{Lj}$ and shift register 2 are constructed in the form of a single IC chip 4, as indicated by the one-dotted line. It should also be noted that all of these circuit elements are formed on the same substrate.

Now, the detailed device structure of the ebbodiment illustrated in FIG. 6 will be described with particular reference to FIGS. 7 through 9. The present image sensing device includes a substrate 3 of glass, ceramics or other appropriate materials, and on the surface of the substrate 3 is formed thin films of photoconductive materials such as CdS, CdSe, amorphous Si, etc. by any well known method such as sputtering, plasma CVD and evaporation. Then the thus formed thin films are patterned by the photoetching method to define the photoelectric elements $P_{ij}$ and blocking diodes $D_{ij}$ in the form of an array. The blocking diodes $D_{ij}$ may be of the Schottky type including a semiconductive film and a metal electrode, or they may be of the PN junction type including two films each comprised of a different semiconductive material such as CdS/Te. If the blocking diodes $D_{ij}$ are to be formed in the latter form, a thin film of Te is formed on a thin film of CdS, as described above, and, then, the photoetching technique is applied to pattern the films into an array of blocking diodes $D_{ij}$.

Then, after forming a thin film of NiCr, a thin film of Au is formed on the NiCr film, for example, by evaporation. Thereafter, a photoresist layer is formed covering the entire surface and windows are formed in the photoresist layer at those locations which correspond in area to the common electrodes $B_i$ (or 5) and the end or bonding) portions 6 of the individual electrodes $e_{ij}$ and then Au plating is carried out to deposit Au to form electrically conductive areas at 5 and 6. Then the photoetching technique is applied to pattern the NiCr and Au films to define the common electrodes $B_i$ and the individual electrodes $e_{ij}$ formed by strips generally in the shape of "L." The individual electrodes $e_{ij}$ in one block are different in size from each other; however, the corresponding individual electrodes $e_{ij}$ belonging to the different blocks have the same shape. In general, each individual electrode $e_{ij}$ includes a vertical section extending straight from the corresponding blocking diode $D_{ij}$ and a horizontal section extending in the direction perpendicular to the vertical section from the tip end thereof, the horizontal section lying over the corresponding interconnection $L_j$ as best shown in FIG. 8.

Figure 9:
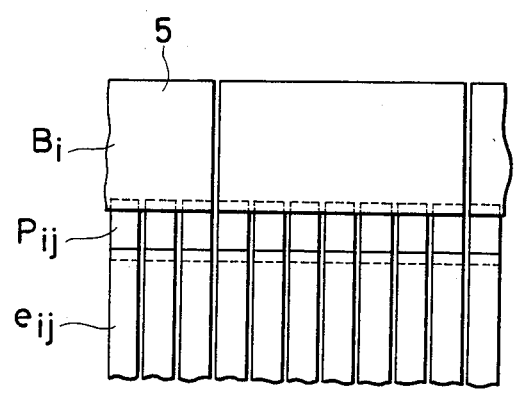
FIG. 9 is a plan view showing on an enlarged scale a part of the array of photoelectric elements in the structure of FIG. 8.

FIG. 9 shows the detailed structure of a part of the image sensing device embodying the present invention in which a plurality of photoelectric elements $P_{ij}$ are grouped into a desired number of blocks each having seven photoelectric elements $P_{ij}$. As shown, the photoelectric elements $P_{ij}$ are arranged as spaced apart from each other in the form of a single array. The common electrodes $B_i$ are formed at one side of the array of elements $P_{ij}$ such that each of the common electrodes $B_i$ is connected to the seven elements $P_{ij}$ which forms one block. On the other hand, the individual electrodes $e_{ij}$ are provided on the opposite side of the array such that each of the electrodes $e_{ij}$ is connected to and extending from the corresponding photoelectric element $P_{ij}$. It is to be noted that the connection between the blocking diode $D_{ij}$ and the indivisual electrode $e_{ij}$ is similarly structured.

Then a flexible print 7a is bonded to the common electrodes $B_i$ of the substrate 3 by thermocompression bonding. The IC chip 1 is mounted on the flexible print 7a which has interconnecting leads formed thereon for connecting the IC chip to the common electrodes $B_i$ and the IC chip to terminals for connection with external circuits. It is to be noted that bonding sections are defined, for example by solder, on the bottom surface of the flexible print 7a corresponding in location to the common electrodes $B_i$ of the substrate 3, and, thus, the bonding sections of the flexible print 7a may be bonded to the common electrodes $B_i$ of the substrate 3 by thermocompression to establish electrical connections between the IC chip 1 mounted on the flexible print 7a and the common electrodes $B_i$. On the other hand, another flexible print 7b is fixedly provided on the substrate 3 in parallel with the flexible print 7a. The flexible print 7b has m interconnection leads $L_1, L_2, \ldots, L_m$ as printed thereon, and the IC chip 4 including the shift register 2, MOS transistors $S_j$, etc. is bonded to the flexible print 7b so that the elements in the IC chip 4 are electrically connected to the interconnections $L_j$. Furthermore, on the bottom surface of the flexible print 7b are defined bonding sections of solder and the like, each electrically connected to the corresponding interconnection $L_j$, corresponding in location to the end or bonding portions 6 of the individual electrodes $e_{ij}$, and thus the bonding sections of the flexible print 7b are thermocompression bonded to the end or bonding portions of the individual electrodes $e_{ij}$. In this manner, the individual electrodes $e_{ij}$ are electrically connected to the respective interconnections $L_j$.

When constructed as described above, the image sensing device for m=32 and n=54, each of the IC chips 1 and 4 has the size of 5 mm squared; the width of each interconnection $L_j$ and the spacing between the two adjacent interconnections $L_j$ are both approximately 0.2 mm; and each of the flexible prints 7a and 7b has the width of approximately 14.5 mm. Accordingly, the size of the overall structure is approximately 35 mm in width and approximately 250 mm in length, which is remarkably compact and yet which includes the scanning or driving circuit mounted on the substrate with the capability of providing a high resolution of 32×54 bits.

Figure 10:
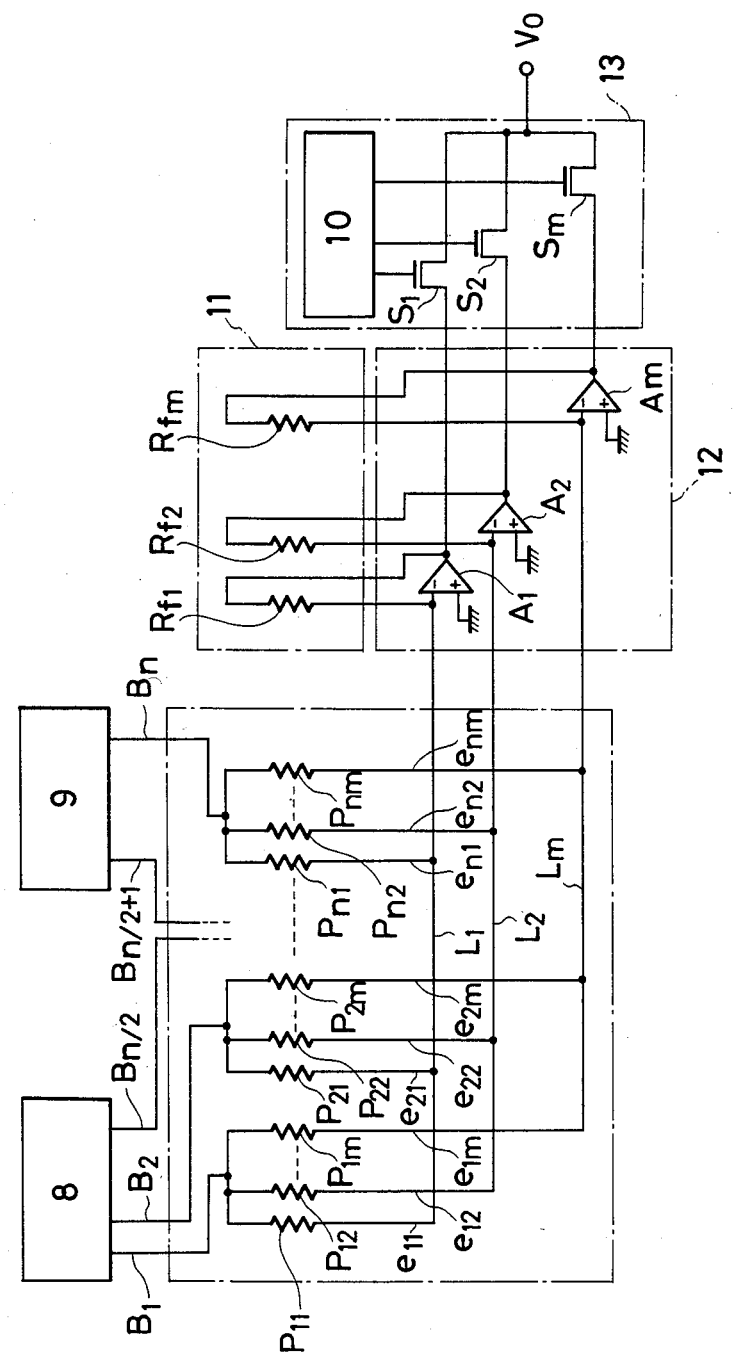
FIG. 10 is a schematic illustration showing a further embodiment of the image sensing device constructed in accordance with the present invention.
Figure 11:
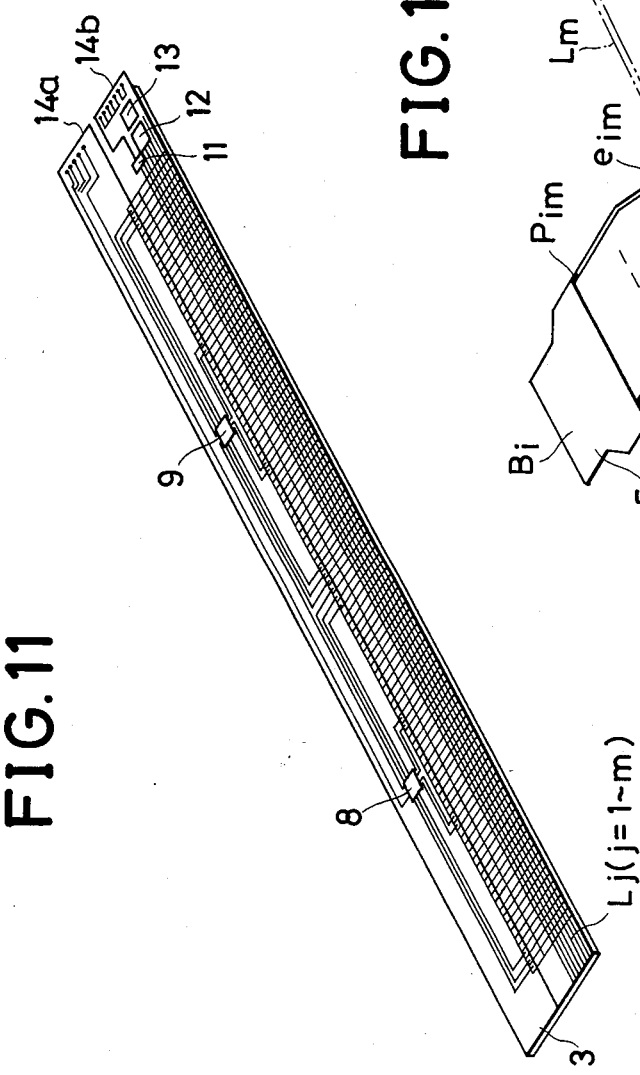
FIG. 11 is a perspective view of the image sensing device which structurally corresponds to the embodiment of FIG. 10.
Figure 12:
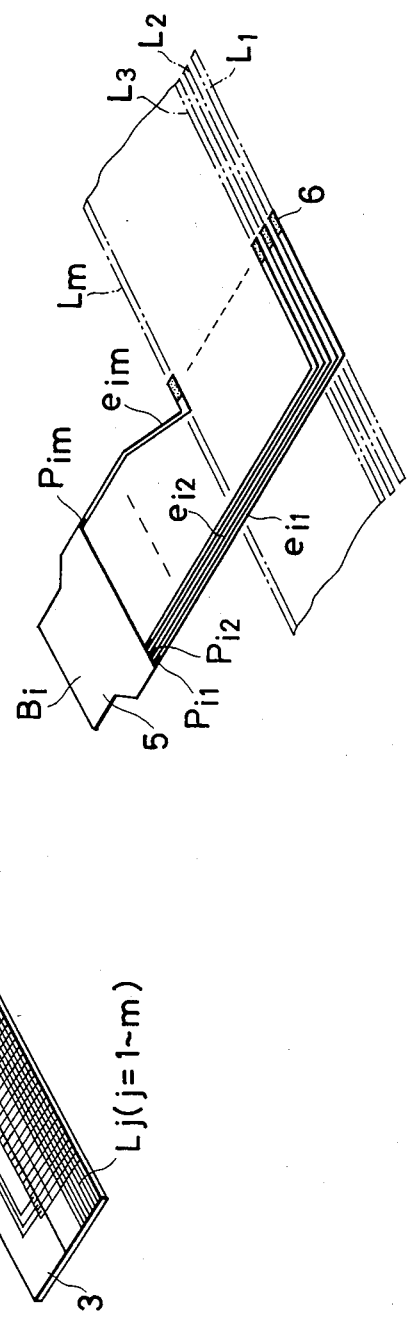

A still further embodiment of the present invention will be described with reference to FIGS. 10 through 15. As shown in FIG. 10, a plurality (mxn) of photoelectric elements $P_{ij}$ are provided as grouped in n blocks each having m number of elements $P_{ij}$. The top ends of the m elements $P_{ij}$ in the same block are commonly connected to the corresponding common electrode $B_i$, and the bottom ends of the elements $P_{ij}$ are connected to individual electrodes $e_{ij}$. The corresponding individual electrodes $e_{ij}$ belonging to different blocks are commonly connected to corresponding interconnections $L_j$. And each of the interconnections $L_j$ is connected to the inverting input of the corresponding operational amplifier $A_j$ (j=1−m). The operational amplifiers $A_j$ have their outputs connected to the output terminal through respective MOS switches $S_j$ which function as analog switches. Furthermore, a feed-back resistor $R_{fj}$ is provided as connected between the output and inverting input of the op amp $A_j$ with its non-inverting input grounded. Among the common electrodes $B_i$ (i=1, ..., n), a half (i=1, ..., n/2) is connected to a n/2 bit e.g., 54 bits) shift register constructed in the form of a single IC chip and the other half (i=n/2+1, ..., n) is connected to a similar shift register 9. Another m bit (e.g., 16 bits) shift register 10 is provided as connected to the gates of MOS transistors $S_j$. As indicated by the one-dotted lines in FIG. 10, all of the op amps $A_j$ are constructed in the form of a single IC chip 12 and the MOS transistors $S_j$ and the shift register 10 are formed in a single IC chip 13. And, as will be fully described later, all of these circuits are integrally provided on the same substrate.

In manufacture, on the surface of the substrate 3 is formed a thin film of photoconductive material such as CdS, for example, by evaporation. Then any well known photoetching technique is applied to pattern the thus formed photoconductive thin film to define a plurality of photoelectric elements $P_{ij}$ in the form of an array and at the same time m feed-back resistors $R_{fj}$ thereby forming a feed-back resistor section 11 at one end portion of the substrate 3. Then on the surface of the substrate 3 is formed a NiCr layer and an Au layer is formed thereon, for example, by evaporation. And Au is electroplated at selected sections of the Au thin film. These layers are then patterned by the photoetching technique to define the common electrodes $B_i$, individual electrodes $e_{ij}$ and leads of the feed-back resistors $R_{fj}$. The Au-plated sections are the end portions of the individual electrodes $e_{ij}$ and the leads $f_j$ and these electroplated sections defined at the end portions 6 of the individual electrodes $e_{ij}$ and the end portions 6a and 6b of the leads $f_j$ form bonding portions.

Figure 13:
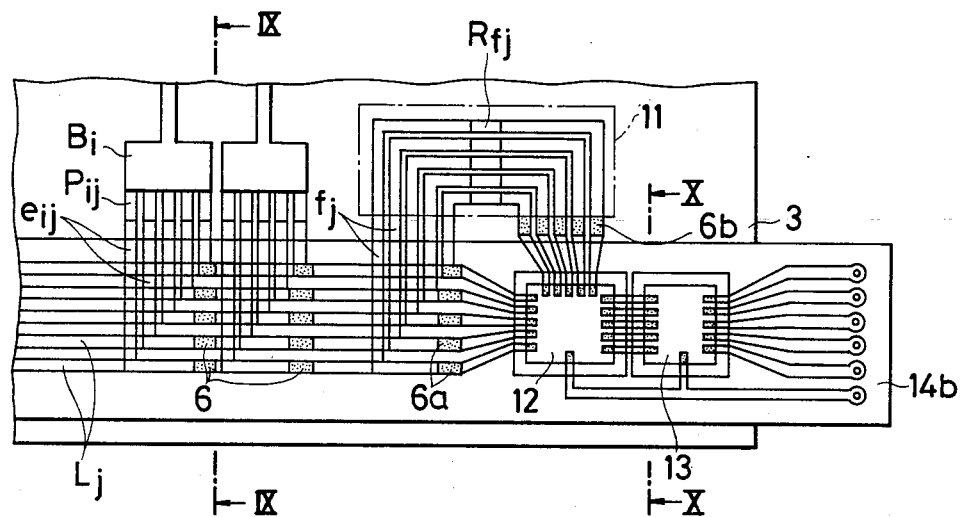
FIG. 13 is a plan view showing on an enlarged scale the end portion of the device of FIG. 11.

A flexible print 14a is attached to the top surface of the substrate 3 and IC chips 8 and 9 are bonded to the print 14a. Conductor lines are printed on the print 14a so that the IC chips 8 and 9 are connected to the respective common electrodes $B_i$ and the terminals for connection with external circuits through the printed conductor lines. As described with respect to the previous embodiment, bonding sections respectively connected to the conductor lines are provided on the bottom surface of the flexible print 14a and these bonding sections are thermocompression-bonded to the common electrodes $B_i$. In this manner, electrical connections are established between the IC chips 8,9 and the common electrodes $B_i$. Another flexible print 14b is also attached to the substrate 3 and the interconnection lines $L_j$ are printed on the flexible print 14b with the IC chips 12, 13 bonded thereto at one end. As best shown in FIG. 13, the interconnections $L_j$ are connected to the IC chip 12 which, in turn, is connected to the IC chip 13 which is then connected to the terminals to be used for connection with external circuits.

Figure 14:
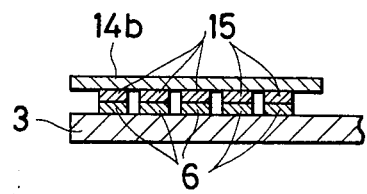
FIG. 14 is a cross sectional view taken along IX—IX line in FIG. 13.
Figure 15:
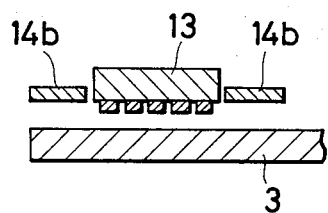
FIG. 15 is a cross sectional view taken along X—X line in FIG. 13.

As shown in FIG. 14, the back side of the flexible print 14b is provided with bonding sections 15 at selected locations of the interconnections $L_j$ and they are bonded by thermocompression to the bonding portions 6 of the individual electrodes $e_{ij}$ to establish electrical connections between the interconnections $L_j$ and the corresponding individual electrodes $e_{ij}$. Moreover, the leads $f_j$ and the interconnections $L_j$ are connected via the bonding sections 6a, and the leads $f_j$ and the IC chip 12 are connected via the bonding sections 6b.

In the thus structured image sensing device for m=16 and n=108, for example, each of the IC chips 8 and 9 has the size of 5 mm squared and the width of each of and the spacing between the interconnection lines $L_j$ are both aporoximately 0.2 mm, and, therefore, the flexible prints 14a and 14b have the width of about 14.4 mm and 8.2 mm, respectively. As a result, the device as a whole has the width of approximately 30 mm and the length of approximately 250 mm, which is remarkably compact in size as an image sensing device incorporating the scanning or driving circuit mounted on the substrate and providing the resolution of 16×108 bits per single scanning line.

Now, it will be described as to the structure and method of manufacturing photoelectric elements which are particularly suited to be applied to the image sensing device as described above. As mentioned above, the present image sensing device may be advantageously applied as an optical reading unit of facsimile machines, digital copiers and the like for reading an original image or document. In such applications, the performance of the image sensing device largely depends upon the sensitivity and light-responsive characteristics of the photoelectric elements formed in the device. As a result, to improve the performance of the image sensing device requires enhancement in characteristics of the photoelectric elements used. In this connection, an activation technique has been proposed for improving the photoelectric characteristics of an alloy of CdS, CdSe, or CdS-Se, as disclosed in the Japanese Patent Laid-open Publication, No. 57-48279. The disclosed technique is directed to improve the light-responsive characteristics of a photoconductive film of CdS and the like, which is high in sensitivity but slow in light-responsive speed, by subjecting it to activation treatment using $CdCl_2$ powder as an activating agent. The activated film indicated the rising time, i.e., time required for the voltage under illumination to reach 90% of the maximum level, of 13.5 msec. at most and the falling time, i.e., time required for the voltage under illumination to drop to 10% of the maximum level, of approximately 9 msec.

Figure 16:
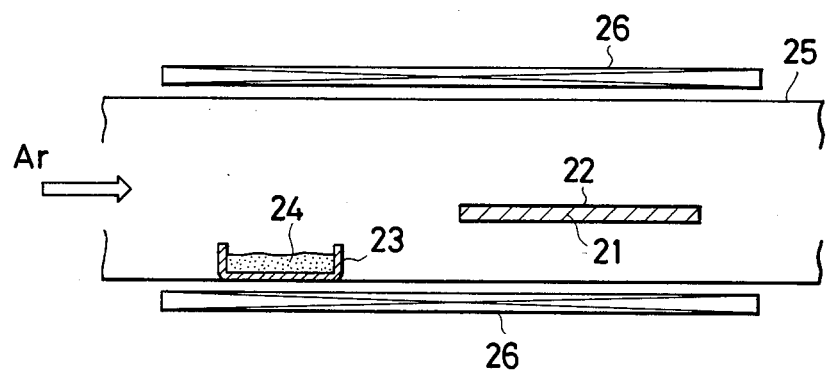
FIG. 16 is a schematic illustration showing a setup for carrying out the method of manufacturing a photoelectric element, suited for use in an image sensing device, in accordance with the present invention.

On the other hand, the present invention provides photoelectric elements which are much higher in sensitivity as well as in light-responsive speed as compared with the prior art elements. The present invention is characterized by using $CuCl_2$ as an activating agent instead of $CdCl_2$ in the above-noted prior art technology. FIG. 16 schematically illustrates the setup for manufacturing photoelectric elements of the present invention. As shown, a substrate 21 formed on its surface a photoconductive film 22 is positioned in a reaction tube 25 of quartz. The photoconductive film 22 may have a mono-layer or multi-layer structure, and it may be formed from various photoconductive materials such as CdS, CdSe and $CdS_xCdSe_{1-x}$ (0<x<1). For forming the film 22, any well known film forming technology such as sputtering, evaporation, CVD and spraying may be used as desired; however, sputtering is preferred considering intimacy in contact with the substrate 21 and the photoelectric characteristics of the photoconductive film 22. In the case of forming the photoconductive film 22 by sputtering, it is preferred that the substrate 21 is maintained at the temperature ranging from 100° to 300° C., preferably from 200° to 300° C., and the surrounding atmosphere is formed by inert gas such as Ar gas at the pressure ranging from 1 to 40 mmHg, preferably from 5 to 10 mmHg, with applied power ranging from 0.5 to 2 W/cm². Under the above-described conditions, the film 22 is formed on the substrate 21 to the thickness ranging from 0.5 to 5 microns, preferably from 1 to 2 microns.

As shown by the arrow, the Ar gas may be flowed through the tube 25, and a quartz boat 23 containing therein a quantity of $CuCl_2$ powder 24 is positioned on the inner wall of the tube 25 and in the upstream of and spaced apart over a predetermined distance from the substrate 21 with respect to the flowing direction of the Ar gas. The amount of $CuCl_2$ powder 24 contained in the boat 23 is in the range between 50 and 500 mg, preferably 100 and 200 mg, and the flow rate of Ar gas is preferably set in the range between 0.5 and 5 litters/min. Also provided is a cylindrical heater 26, as placed around the reaction tube 25, for heating the substrate 21, film 22 and CuCl$_2$ powder 24 to a desired temperature, and the heater 26 is preferably so structured as to have the substrate 21 and the boat 23 located within the uniform heating region so that the film 22 and CuCl$_2$ powder 24 may be heated substantially to the same temperature in the range between 200° and 600° C., preferably between 350° and 500° C., for the time period of 30 to 60 minutes.

As described above, when the CuCl$_2$ powder 24 becomes heated, it is evaporated into the Ar gas flow, and the CuCl$_2$ vapor thus evaporated reacts with the photoconductive film 22 whereby Cl atoms are filled into vacancies of S or Se existing in the film 22 thereby forming doner levels. Besides, Cu atoms are filled into Cd vacancies in the film 22 thereby forming acceptor levels. The doner levels thus formed by added Cl atoms function as trap centers for electrons in the film 22, so that they contribute to enhance the sensitivity of the photoconductive film 22; on the other hand, the acceptor levels created by added Cu atoms function as centers of recombination in the film 22, so that they contribute to increase the light-responding speed of the film 22.

Accordingly, in the present photoelectric elements including the photoconductive film 22, since the vacancies of S or Se are at least partly filled by Cl atoms and the vacancies of Cd are at least partly filled by Cu atoms in the photoconductive film 22, the donor levels created by the added Cl atoms function as trap centers for electrons and the acceptor levels created by the added Cu atoms function as recombination centers, so that the film 22 is remarkably high in sensitivity and in light-responding speed. It should also be noted that the present invention allows to manufacture photoelectric elements of excellent characteristics easily by using a simple setup.

Figure 17:
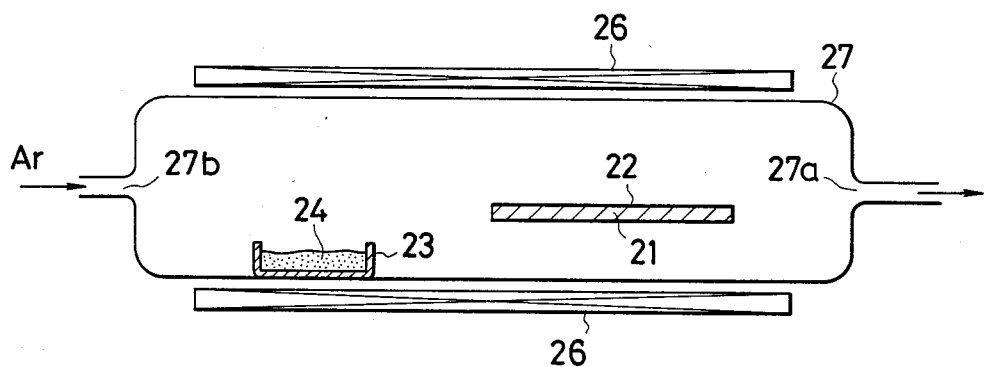
FIG. 17 is a schematic illustration showing another setup for carrying out the method of manufacturing a photoelectric element, suited for use in an image sensing device, in accordance with the present invention.

FIG. 17 illustrates another setup for manufacturing the present photoelectric elements and it is not much different from the setup illustrated in FIG. 16, and thus like numerals are employed to indicate like elements without repeated description for the same elements. As shown in FIG. 17, both ends of the reaction tube 27 of quartz are so structured that they may be closed, and thus the substrate 21 and the boat 23 containing therein CuCl$_2$ powder 24 may be sealingly provided inside of the tube 27. An opening 27a provided at one end surface of the tube 27 is connected to a vacuum system (not shown) such as a diffusion pump or rotary pump, and, thus, the interior of the tube 27 may be maintained at the vacuum condition. The other end surface of the tube 27 is provided with an opening 27b which is connected to an inert gas source (not shown) such as Ar gas thereby allowing to supply Ar gas into the tube 27 at a desired flow rate. Accordingly, by supplying Ar gas into the tube 27 through the opening 27b while vacuuming the tube 27 through the opening 27a, the atmosphere surrounding the photoconductive film 22 and CuCl$_2$ powder 24 may be formed by Ar gas at a reduced pressure. The gas pressure inside of the tube 27 is preferably set in the range between approximately $10^{-2}$ and $10^2$ mmHg. Under such reduced pressure conditions, heat treatment is carried out similarly with the previous case, and, thus, the photoconductive film 22 becomes activated as desired thereby allowing to produce photoelectric elements of excellent characteristics. Incidentally, in the present example, since activation treatment is carried out under reduced pressure, the free mean path of CuCl$_2$ vapor is relatively longer so that the activation treatment can be carried out uniformly across a larger area of the photoconductive film 22. It is to be noted that use may be made of other inert gases than Ar.

Figure 18:
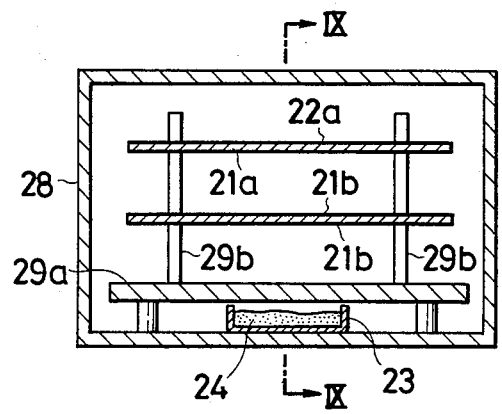
FIG. 18 is a schematic illustration showing a further setup for carrying out the method of manufacturing a photoelectric element, suited for use in an image sensing device, in accordance with the present invention.
Figure 19:
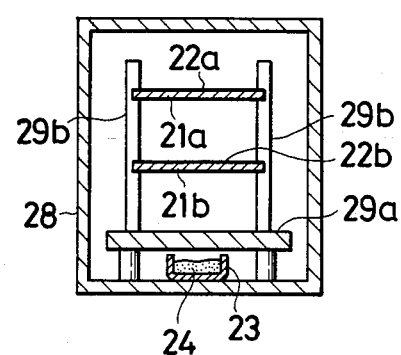
FIG. 19 is a cross sectional view taken along IV—IV line in FIG. 18.

A further setup for manufacturing the present photoelectric elements is illustrate in FIGS. 18 and 19. As illustrated, inside of a reaction chamber 28 of quartz is disposed a table 29a which is provided with supporting poles 29b one at each corner of the rectangular table 29a. A pair of substrates 21a and 21b are provided as supported by the four supporting poles 29b such that the substrate 21b is located below the substrate 21a. On the substrates 21a and 21b are formed photoconductive films 22a and 22b, respectively. The quartz boat 23 containing therein a quantity of CuCl$_2$ powder 24 is positioned below the table 29a. The chamber 28 may be filled with air, or it may be filled with an inert gas such as Ar gas. The chamber 28 may also be connected to a vacuum system to be set at a reduced pressure state. In this example, the chamber 28 is placed in a furnace to carry out a desired heat treatment. It is to be noted that this example is advantageous because a larger number of photoconductive films may be subjected to activation treatment at a time.

Figure 20:
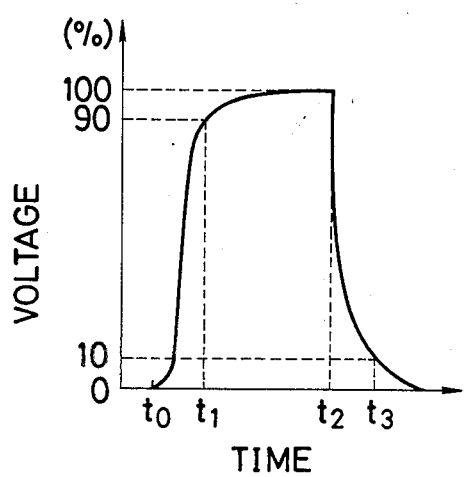
FIG. 20 is a graph showing the general light response characteristic of a photoelectric element.

Now, re,ferring to FIGS. 20 through 22, it will be described how the present photoelectric element manufactured in accordance with either one of the methods described above is improved in characteristics. For this purpose, a pair of electrodes each comprised of NiCr and Au are provided as connected to a photoconductive film, and with a voltage applied between the electrodes, use is made of a light emitting diode for emitting green light as a light source to apply the green light of 300 luxes to the photoconductive film. Under the circumstances, the light-responding characteristic may be indicated by the variation in voltage under illumination or photocurrent as shown in the graph of FIG. 20, the ordinate of which is taken for voltage and the abscissa of which is taken for time. In the graph, $t_0$ indicates the time of initiation of illumination; $t_1$ the time for the voltage to reach 90% of the maximum level; $t_2$ the time of termination of illumination; and $t_3$ the time for the voltage to reach 10% of the maximum level. Therefore, the shorter the rising time defined by $t_1-t_0$ and/or the falling time defined by $t_3-t_2$, the faster the light-responding speed of the photoconductive film.

Figure 21:
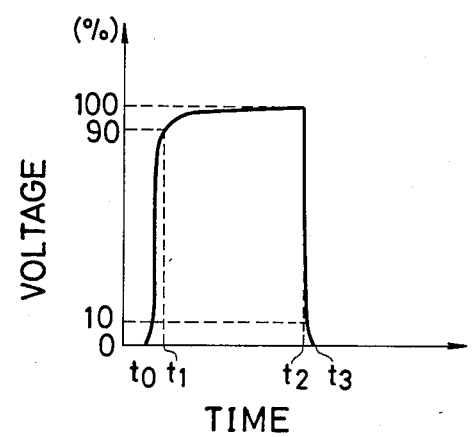
FIG. 21 is a graph showing the light response characteristic of a photoelectric element manufactured in accordance with the present invention.
Figure 22:
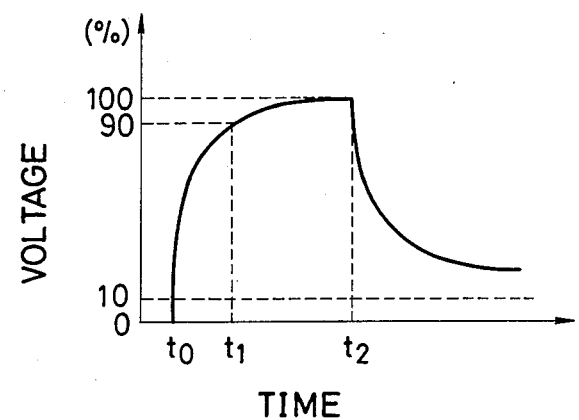
FIG. 22 is a graph showing the light response characteristic of a photoelectric element manufactured in accordance with the prior art method.

With the foregoing in mind, FIG. 21 shows the typical curve for the present photoelectric element; whereas, FIG. 22 shows the typical curve for the photoconductive film of CdS, CdSe, CdS$_x$CdSe$_{1-x}$ and the like which is not subjected to activation treatment according to the present invention. As is shown in FIG. 22, in the case of a non-activated photoconductive film, the rising time is about 13 msec. and the falling time is about 40 msec. On the other hand, in the case of an activated photoconductive film in accordance with the present invention, the rising time is about 1.0 msec. and the falling time is about 0.3 msec, as schematically shown in FIG. 21. It is to be also noted that the activation by CuCl$_2$ also allows to remarkably improve the rising and falling characteristics as compared with the prior art method of using CdCl$_2$ as an activating agent. Also importantly, light sensitivity of a photoconductive film, defined by the ratio of current with illumination to current without illumination, has been found to be $10^2$ or less before the present activation treatment and $10^5$ or more after the present activation treatment.

Figure 23:
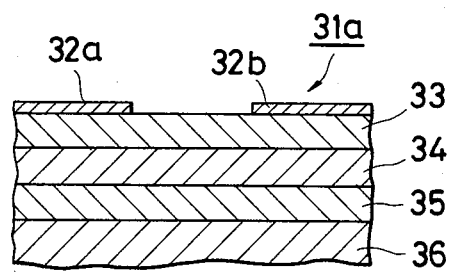
FIG. 23 is a cross sectional view showing the structure of a photoelectric element constructed in accordance with one embodiment of the present invention.
Figure 24:
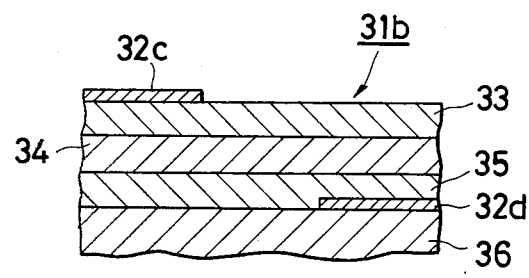
FIG. 24 is a cross sectional view showing the structure of a photoelectric element constructed in accordance with another embodiment of the present invention.
Figure 25:
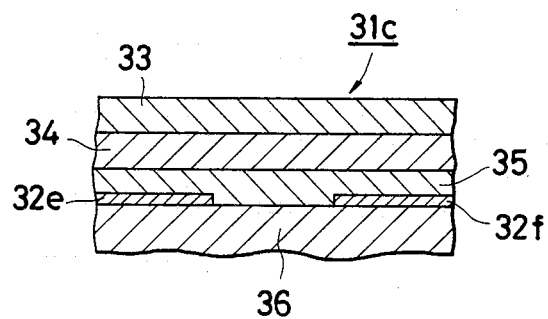
FIG. 25 is a cross sectional view showing the structure of a photoelectric element constructed in accordance with a further embodiment of the present invention.

FIGS. 23 through 25 show several embodiments of the present photoelectric element when constructed to have a three-layer structure so as to enhance sensitivity and light-responding characteristics at the same time significantly thereby making particularly suitable for use in an image sensing device. It should first be noted that the three embodiments shown in FIGS. 23 through 25 have basically the same structure and the sole difference exists in the arrangement of electrodes.

The photoelectric element 31a shown in FIG. 23 includes a substrate 36 of ceramics, glass, etc. and a three-layer photoconductive structure formed on the substrate 36, comprising a CdS layer 35, a CdSe layer 34 and a CdS layer 33 formed on top of another in the order mentioned. These layers may be formed by any well-known method such as sputtering, evaporation, electron beam deposition, etc. After formation of these layers, the entire structure is placed in a furnace to carry out heat treatment thereby making the boundaries between the adjacent layers to possess required characteristics. Moreover, on the top surface of the CdS layer 33 is formed a pair of electrodes 32a and 32b spaced apart from each other to define a slit or window therebetween through which light may be irradiated to the CdS layer 33.

FIG. 24 shows another photoelectric element 31b which includes an electrode 32d formed on the substrate 36 and the other electrode 32c formed on the three-layer photoconductive structure including the CdS layer 35, CdSe layer 34 and CdS layer 33 in the order mentioned. And, it is to be noted that the overlying electrode 32c is spaced apart sidewise from the underlying electrode 32d to define a slit or window therebetween. FIG. 25 shows a still another photoelectric element 31c in which both of the electrodes 32e and 32f are formed on the substrate 36 as spaced apart from each other and the three-layer photoconductive structure is formed thereon. It is to be noted that the structures shown in FIGS. 24 and 25 may be constructed by using the similar techniques as described with respect to the structure of FIG. 23.

Figure 26:
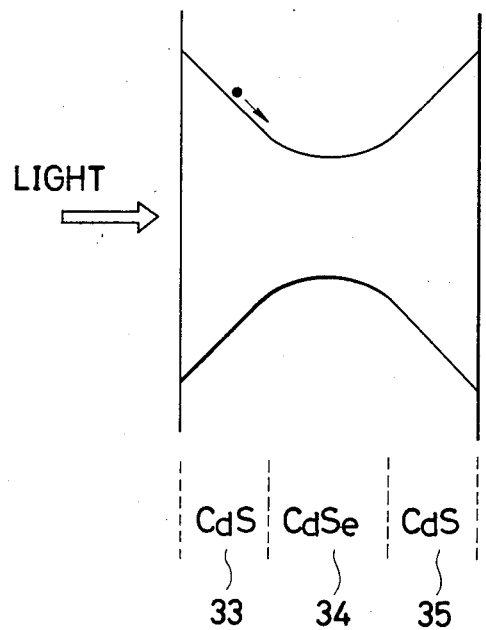
FIG. 26 is a schematic illustration showing the energy band model of a three-layer photoelectric element.

In either of the above-described structures, while applying a predetermined voltage between the paired electrodes 32a and 32b, 32c and 32d or 32e and 32f, when light is irradiated to the surface of the CdS layer 33, carriers are produced and they migrate in the photoconductive layers toward the electrodes, which are then detected as photocurrent. FIG. 26 illustrates the band model of the three-layer photoconductive structure including CdS 33, CdSe 34 and CdS 35 layers, and, as shown, the band gap energy of CdSe is smaller than that of CdS. As indicated by the arrow in FIG. 26, when light is irradiated to the surface of CdS layer 33, carriers are produced in the surface region, which then drift into the CdSe layer 34 due to an internal electric field formed between the CdS and CdSe layers 33, 34. Since electron mobilities in the CdS and CeSe layers 33, 34 are 300 and 530 cm$^2$/V-sec, respectively, electrons are much easier to move in the CdSe layer 34. Accordingly, the carriers produced inside the CdS layer 33 due to light irradiation drift into the CdSe layer 34 and then move toward the electrode inside the CdSe layer 34 following the electric field created inside the CdSe layer 34 due to the voltage applied between the paired electrodes. As explained above, since the carriers move in the CdSe layer 34 which is sandwiched between the CdS layers 33 and 35 and higher in mobility in accordance with the present invention, they can be collected by the electrodes much sooner after production (irradiation), so that the light-responding speed of the present photoelectric element is significantly enhanced. Moreover, since electrodes are not in contact with the CdSe layer 34 acting as a major current carrier, no significant recombination or disappearance of carriers take place in the vicinity of the electrodes, and, therefore, light sensitivity is remarkably improved.

Figure 27:
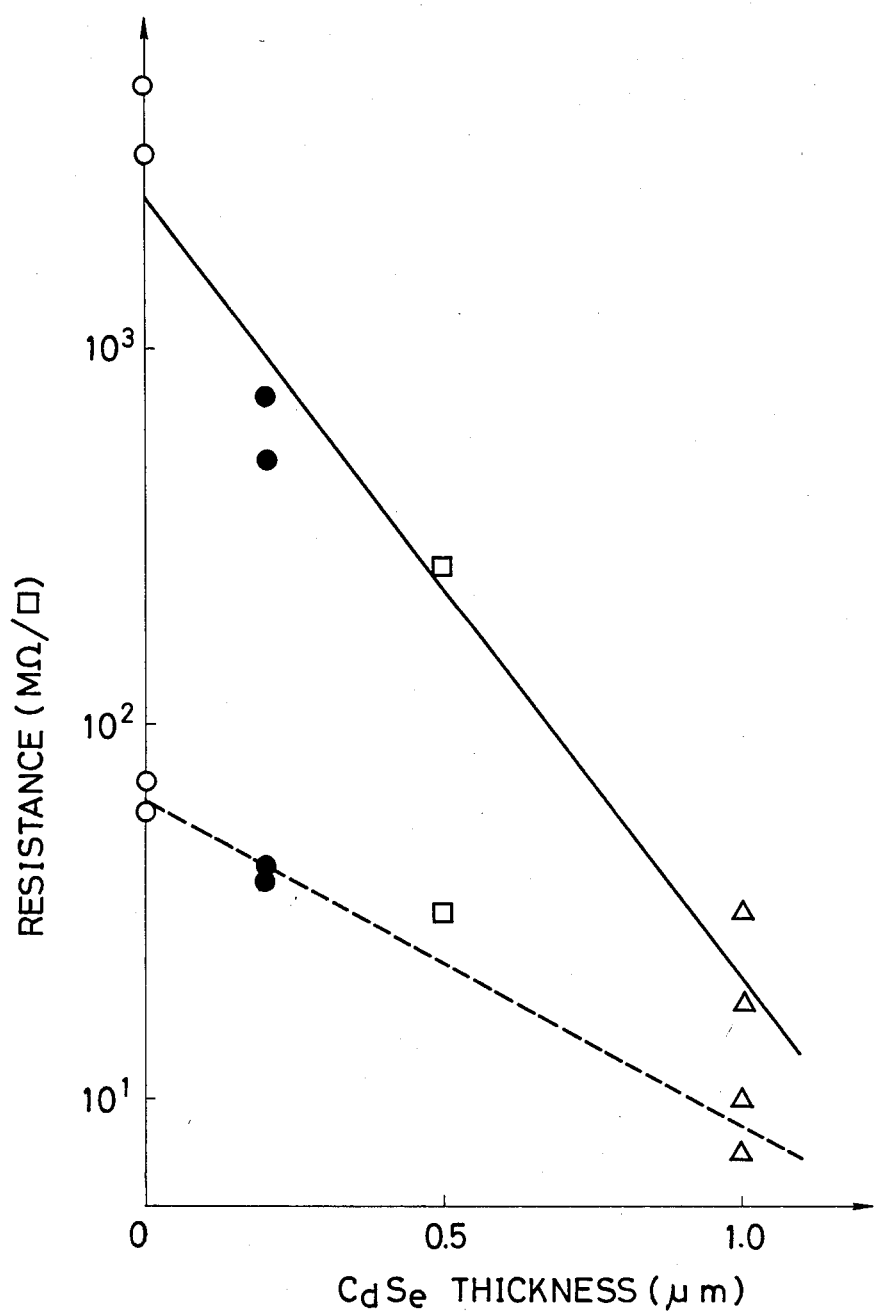
Figure 30:
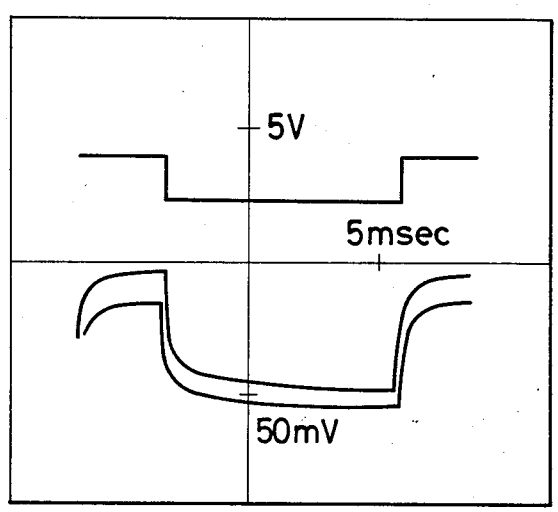

The characteristics of the photoelectric element such as those illustrated in FIGS. 23 through 25 vary depending upon such parameters as the thickness of CdSe layer 34 and the temperature of heat treatment. FIG. 27 shows a graph showing the relation between the thickness in microns of CdSe layer 34 and its electrical resistance in meg-ohms/square. In this case, the CdS layers 33 and 35 are assumed to have a constant thickness of 1 micron. And, the data for the zero thickness of CdSe layer 34 corresponds to the resistance of a 1 micron thick CdS layer formed under the same sputtering conditions. The solid line in the graph is for the case without illumination and the dotted line is for the case with illumination. As is obvious from the graph, the thicker the CdSe layer 34 is, the lower the resistance is with or without illumination, and, thus, the carriers are much easier to move. FIG. 28 shows the relation between the temperature of heat treatment and the rising time; whereas, FIG. 29 shows the relation between the temperature of heat treatment and the falling time. The data were taken with maintaining the CdS layers 33 and 35 constant in thickness at 0.5 microns. The black dots in the graphs correspond to the CdSe layer 34 having the thickness of 0.5 microns and the white dots correspond to the CdSe layer 34 having the thickness of 1.0 micron. As indicated clearly, the rising time is 1 msec. or less and the falling time is in the order of a few msecs., which implies that the present photoelectric element has an extremely fast light-responding speed. As the heat treatment temperature goes up, the rising time becomes shorter thereby showing the potentiality of further improving the light-responding characteristic. In addition, as the CdSe layer 34 becomes thicker, there is a tendency to reduce the rising time and to increase the falling time. FIG. 30 shows the voltage changes between the paired electrodes such as 32a and 32b when the light is irradiated switchingly for a predetermined time period. As shown, the rising and falling characteristics may be set at approximately 1 msec. by appropriately selecting the kind of light source, the thickness of CdSe layer 34, etc.

Although the three-layer structure described above has the sandwiching layers of CdS and the sandwiched layer of CdSe, other photoconductive materials may be equally used as long as the sandwiched layer is selected to possess the smaller band gap energy, and one of the three layers in any of the above-described embodiment may be replaced by a solid solution of $CdS_xSe_{1-x}$, in which case sensitivity may be even further enhanced.

In some applications, photoelectric elements are used with a light source which emits light having a particular wave length. For example, in facsimile machines, use is commonly made of a light source emitting green light whose wave length is approximately 540 nm. Therefore, the present invention is also directed to provide photoelectric elements which are highly sensitive to green light whose wave length is approximately 540 nm and yet extremely high is light-responding speed, and, thus, which are particularly suited to be incorporated into an image sensing device for use in a facsimile machine and the like. A method for manufacturing such photoelectric elements when applied to construct an image sensing device will now be described with particular reference to FIGS. 31 through 33.

Figure 31:
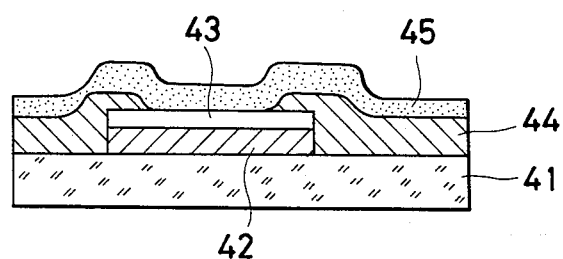
FIG. 31 is a cross sectional view showing the structure of a photoelectric element constructed in an image sensing device in accordance with the present invention.

As shown in FIG. 31, an electrically insulating substrate 41 of glass, ceramics or the like is first provided. And, on the surface of the substrate 41 is formed a CdSe film 42, preferably, to the thickness of 0.1-1.5 microns by applying any well-known film forming technology such as sputtering and evaporation or vapor deposition. Then on the surface of the CdSe film 42 is formed a CdS film 43, preferably, to the thickness of 0.5-5 microns by sputtering, evaporation, etc. After formation of the overlying structure of CdSe and CdS films 42 and 43, the entire structure is subjected to heat treatment in Ar atmosphere at 400°-600° C. for 30-60 minutes. In this case, it is preferable to carry out such heat treatment in the activating atmosphere which contains Cu and $Cl_2$. The preferred activating agents include $CuCl_2$ and CdS powder containing Cu and $Cl_2$.

The thus formed overlying structure including CdSe and CdS films 42 and 43 is then patterned, for example, by any well-known photoetching technology. The preferred etchant to be used in this photoetching process includes a liquid mixture of citric acid and potassium iodide, a liquid mixture of hydrochloric acid and ethyl alcohol and a liquid mixture of phosphoric acid and nitric acid. After etching the two-layer films 42 and 43 into a desired pattern, metal electrodes 44 are formed, preferably in a stacked structure of NiCr and Au films, in a desired pattern by using photoresist on the substrate 41 having thereon the patterned two-layer photoconductive films 42 and 43. Thereafter, the entire surface is coated with a light-transmitting, electrically insulating protective layer 45.

Figure 32:
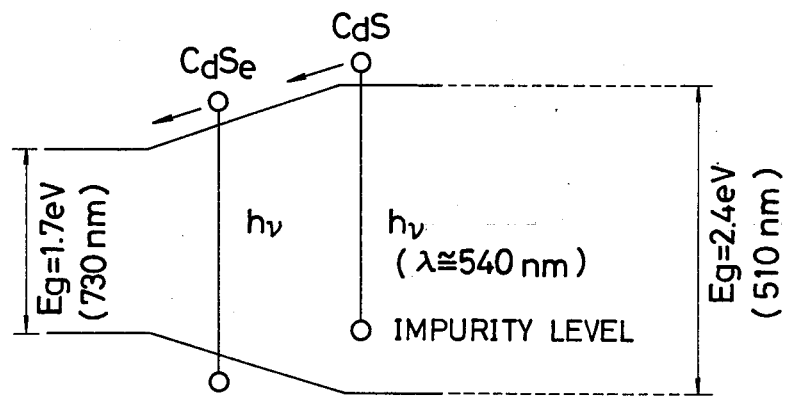
FIG. 32 is a schematic illustration showing the band model of the photoelectric element including CdSe and CdS films.

Although it is not intended to be limited to the following explanation, it will be described as to why the present photoelectric elements manufactured as described above can exhibit excellent photoelectric characteristics. For this purpose, use will be made of a band model or scheme as schematically illustrated in FIG. 32. As shown, when green light having the wave length of approximately 540 nm is incident upon the present photoelectric element from the side of CdS film 43, free electrons are generated from impurity levels and from the band curved region or transition region, defined at the boundary between the CdSe and CdS films 42 and 43, where the band gap energy is smaller than that of CdS. In this case, since the mobility of holes are much smaller than that of electrons in these CdSe and CdS films 42 and 43, the contribution of holes to photocurrent may be neglected without prejudice.

Figure 33:
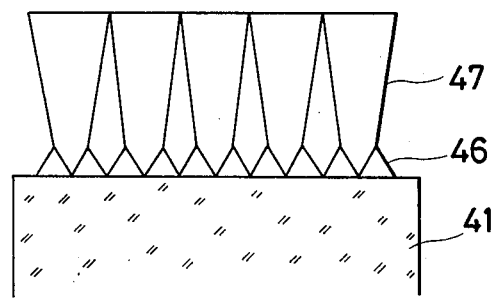
FIG. 33 is a schematic illustration showing the detailed crystal structure of a thin film forming a part of the photoelectric element.

Importantly, a polycrystalline film generally has an internal structure as schematically shown in FIG. 33. That is, that portion of the polycrystalline film which is adjacent to the substrate 41 forms a micro crystal layer 46, and this is the portion which is formed at the initial stage of the film forming process. The surface portion of the polycrystalline film forms a layer 47 whose crystalline structure is rather coarse. Because of this, it is preferable to have light incident upon the film from the side of the surface layer 47 thereby allowing to obtain an increased photocurrent. When light is irradiated from the substrate side, the free electrons generated by photoexcitation will quickly disappear since most of them are recombined at the recombination centers abundant in the micro crystal layer 46. The lifetime of the free electrons in this case is very short, and, thus, the gain of photocurrent is rather low in level. Another advantage accruing from such a structure of light irradiation from the surface side is that the substrate 41 does not have to be transparent to light thereby widening the scope of selection of material for the substrate 41. As described above, the free electrons produced by photoexcitation of incident light from the surface side of CdS film 43 migrate into the CdSe film having a shorter time constant because of the band curve or transition formed at the boundary between the CdS and CdSe films 42 and 43.

Figure 34:
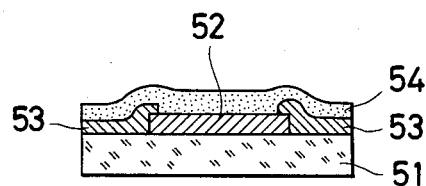
FIG. 34 is a cross sectional view showing the structure of a photoelectric element constructed in an image sensing device in accordance with the present invention.

A still further modification of the present photoelectric element which is particularly suited to be integrated into an image sensing device is schematically illustrated in FIG. 34. As shown, this photoelectric element has a mono-layer structure and it only includes a single photoconductive film, preferably, of CdS on a substrate. It is known that a CdS film, in general, is high in light sensitivity, but slow in light-responding speed. The present invention provides a method for manufacturing such a mono-layer photoelectric element which is high both in light-responding speed and light sensitivity, in particular, when CdS is used to form the mono-layer photoconductive film. It is also to be noted that from a manufacturing viewpoint such a mono-layer structure is more advantageous than the above-described multilayer structure.

Now the present method for manufacturing a mono-layer photoelectric element will be described with reference to FIG. 34. As shown, an electrically insulating substrate 51 of glass, ceramics, etc. is prepared, and, on the substrate 51 is formed a CdS film 52 by sputtering to the thickness of 0.5-10 microns at the pressure ranging from 1 to 20 Pa and the substrate temperature ranging from 100° to 300° C. After formation of the CdS film 52, the entire structure is heat-treated in an Ar atmosphere at 400°-600° C. for 30-60 minutes. Preferably, the heat treatment is carried out in the atmosphere containing Cu and/or $Cl_2$, whereby the resulting photoelectric characteristic will be further enhanced. In this preferred mode, Cu and/or $Cl_2$ are used as an activating agent. In practice, these activating agents are added into the surrounding atmosphere by using $CuCl_2$ or CdS powder containing Cu and/or $Cl_2$.

The photoconductive film 52 thus obtained is then photoetched into a desired pattern using such a preferred etchant as a liquid mixture of citric acid and potassium iodide or of hydrochloric acid and ethyl alcohol. Then metal electrodes 53, 53 are formed in a desired pattern in a mono-layer or multi-layer structure from a material such as NiCr, Ni, Cr, Al, Au and Ta, though it is not limited only to these materials. However, NiCr is preferred as a material for forming the electrodes 53, 53. Thereafter, the whole surface is coated with an electrically insulating, protective film 54 of glass, silicon oxide, plastics, etc.

Figure 35:
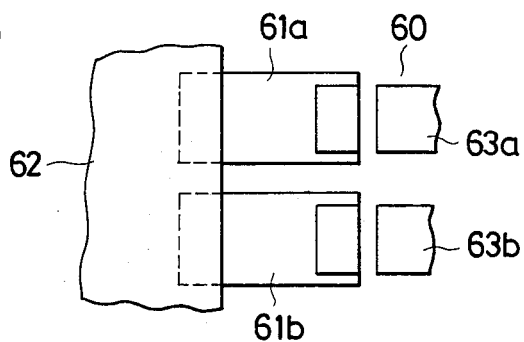
FIGS. 35 and 36 illustrate the conventional manner of connecting a semiconductor device to an arbitrary body such as an image sensing device.

Now, a description will be made as to an improved connecting structure between a semiconductor element such as a photoelectric element and its associated electrodes or interconnection lines especially when a step in height exists therebetween. That is, a typical prior art structure including thin film photoelectric elements and their associated electrodes is shown in FIG. 35. As shown, on an electrically insulating substrate 60 of glass, ceramics, etc. is formed in desired pattern photoconductive films 61a and 61b of CdS, CdSe, ZnS, ZnSe, etc. by evaporation, for example. Then electrodes 62, 63a and 63b are formed on the substrate 60. When forming these electrodes 62, 63a and 63b, a conductive material such as Ni, Cr, NiCr, Au, etc. is first deposited on the entire surface including the films 61a and 61b by evaporation, RF sputtering, or the like, followed by application of photolithography to pattern the conductive film into a desired shape.

Figure 36:
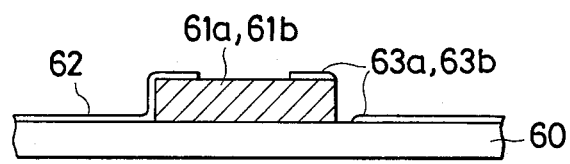

In such a case, it is often observed that the photoconductive films 61a and 61b have the thickness ranging from a few angstroms to a few microns and the electrodes 62, 63a and 63b have the thickness ranging from several hundreds of angstroms to several thousands of angstroms. As a result, the electrodes 62, 63a and 63b are often times have the thickness which is about 1/10 of that of the photoconductive films 61a and 61b. For this reason, a step in height exists between the photoconductive film 61a (61b) and its associated electrodes 62 and 63a (63b), as best shown in FIG. 36. Since such a step is rather large, it could happen that an electrode material is not completely deposited depending on the manner of deposition, for example, the direction of deposition, thereby forming disconnection between the film 61a (61b) and its associated electrode 63a (63b) as shown in FIG. 36. Formation of thicker electrodes is not practical, and, thus, it is necessary to devise some means to insure the formation of required electrical connection between a photoelectric element and its associated electrodes.

Figure 37:
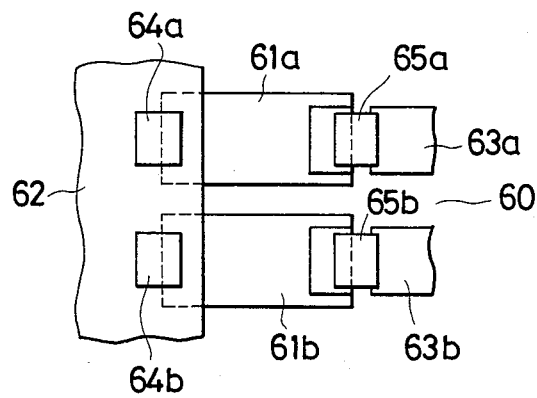
FIGS. 37 and 38 illustrate the manner of connecting a semiconductor device to an arbitrary body such as an image sensing device in accordance with the present invention.
Figure 38:
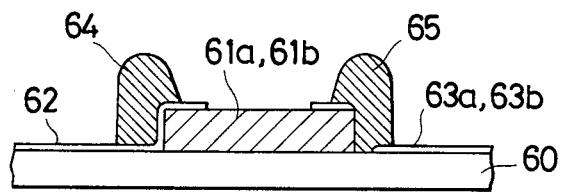

FIGS. 37 and 38 illustrate the improved connecting structure between semiconductor elements such as photoelectric elements and their associated electrodes including interconnection lines constructed in accordance with one embodiment of the present invention. As shown in FIG. 37, on the substrate 60 is formed semiconductor elements such as photoelectric elements 61a and 61b in the form of thin films. On the left hand side of the elements 61a and 61b is formed a common electrode 62 which is to be commonly connected to the photoconductive films 61a and 61b; whereas, on the right hand side of the elements 61a and 61b are formed individual electrodes 63a and 63b which are connected to the photoconductive films 61a and 61b, respectively. The films 61a and 61b may be formed by first depositing a photoconductive material such as CdS, CdSe, ZnS, ZnSe, etc. and then by patterning the thus deposited film into a desired shape. Moreover, the electrodes 62, 63a and 63b may be formed by first depositing a conductive material such as Ni, Cr, NiCr, Au, etc. by evaporation, sputtering, or the like, and then patterning the deposited material into a desired shape by photolithography or the like.

Then, in accordance with the present invention, a photoresist layer is formed to cover the entire surface excepting the locations where steps are formed at the connecting portions between the elements 61a, 61b and the electrodes 62, 63a, 63b. Then an electrically conductive or metal material is deposited to the locations where not covered by the photoresist layer to form metal deposits 64 and 65. Such metal deposits 64 and 65 may be formed by plating with Ni, Au, etc., or application of metal paste. Any plating technique such as electroless plating or electric field plating may be used, and the deposits 64 and 65 are formed to the thickness of approximately 2-3 microns. Thereafter, the photoresist layer is removed by using an appropriate etchant. It is to be noted that the patterning of the deposited conductive material into a desired shape to form electrodes may be carried out after removal of the above-described photoresist to be used for forming the metal deposits 63 and 64.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A photoelectric cell for converting light image information into electrical image signals, comprising:
   a substrate;
   a three-layer photoconductive structure formed on said substrate, said structure including a first photoconductive film formed on said substrate, a second photoconductive film on said first photoconductive film and a third photoconductive film formed on said second photoconductive film, said second photoconductive film having a band gap energy smaller than those of said first and third photoconductive films; and
   a pair of electrodes either one or both of which is formed either on said substrate or on said third photoconductive film such that said electrodes are spaced apart from each other sidewise to define a window therebetween 2. A cell of claim 1 wherein said first and third photoconductive films include CdS and said second photoconductive film includes CdSe.

3. A cell of claim 1 wherein at least one of said first, second and third photoconductive films includes a solid solution of $CdS_xSe_{1-x}$ ($0 < x < 1$).

* * * * *